(12) United States Patent
Akaho

(10) Patent No.: US 9,608,566 B2
(45) Date of Patent: Mar. 28, 2017

(54) CHARGE PUMP CIRCUIT

(71) Applicant: Rohm Co., Ltd., Kyoto (JP)

(72) Inventor: Tadashi Akaho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/073,870

(22) Filed: Mar. 18, 2016

(65) Prior Publication Data

US 2016/0294280 A1 Oct. 6, 2016

(30) Foreign Application Priority Data

Mar. 30, 2015 (JP) ................. 2015-069122

(51) Int. Cl.
| | |
|---|---|
| *G05F 1/10* | (2006.01) |
| *G05F 3/02* | (2006.01) |
| *H03B 5/24* | (2006.01) |
| *H03K 3/03* | (2006.01) |
| *H03K 5/00* | (2006.01) |

(52) U.S. Cl.
CPC ............ *H03B 5/24* (2013.01); *H03K 3/0315* (2013.01); *H03K 5/00006* (2013.01)

(58) Field of Classification Search
USPC .................................. 327/535, 536
See application file for complete search history.

(56) References Cited

U.S. PATENT DOCUMENTS

| | | | |
|---|---|---|---|
| 6,137,732 A | 10/2000 | Inaba | |
| 2002/0075063 A1 | 6/2002 | Hwang | |
| 2005/0157556 A1* | 7/2005 | Matsuda | .................. G11C 8/08 365/185.18 |
| 2008/0116961 A1 | 5/2008 | Yoshikawa et al. | |
| 2008/0136388 A1* | 6/2008 | Senda | ................... H02M 3/073 323/282 |
| 2016/0126835 A1* | 5/2016 | Englekirk | ............. H03L 7/0891 327/536 |
| 2016/0294280 A1* | 10/2016 | Akaho | ..................... H02M 3/07 |

FOREIGN PATENT DOCUMENTS

| | | |
|---|---|---|
| JP | H11-328973 | 11/1999 |
| JP | 2001-112239 | 4/2001 |
| JP | 2002-233135 | 8/2002 |
| JP | 2008-124852 | 5/2008 |

* cited by examiner

*Primary Examiner* — Adam Houston
(74) *Attorney, Agent, or Firm* — Fish & Richardson P.C.

(57) ABSTRACT

When a voltage difference between a raised output voltage vcp and an input voltage vin is larger than a set voltage value, based on a added-on voltage vup detected by a voltage monitor 3 or a current iu passing through the voltage monitor 3, the clock generator controller 4 is activated. Then the clock generator controller 4 draws in a frequency control current iw from a clock generator 1 side, switches the frequency Fclk of a clock signal CLK generated by the clock generator 1 from a first frequency, which is comparatively high, to a second frequency, which is one or more digits lower than the first frequency, and applies the clock signal CLK to the voltage raiser 2. The voltage raiser 2 saves power by performing voltage raising (charge pumping) at the second frequency.

21 Claims, 9 Drawing Sheets

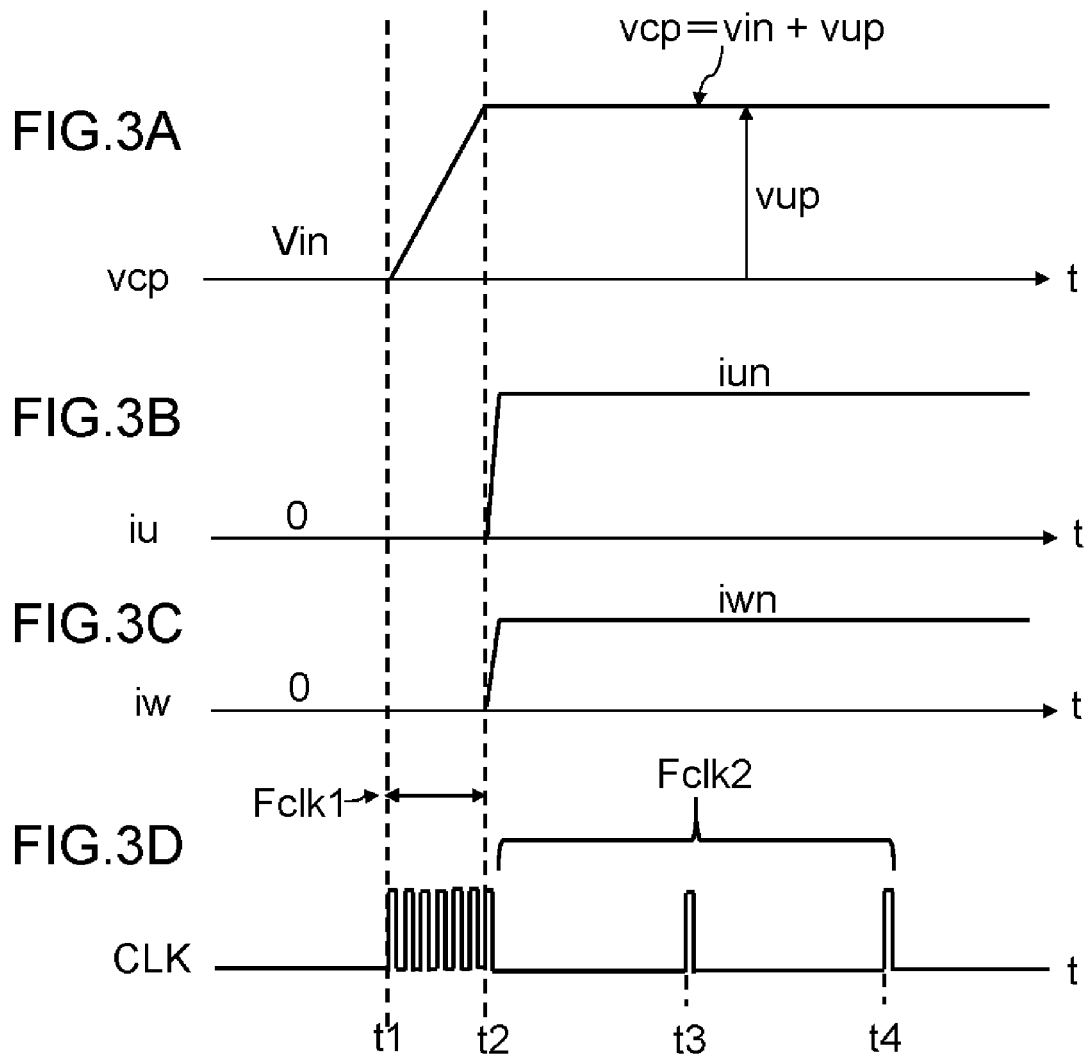

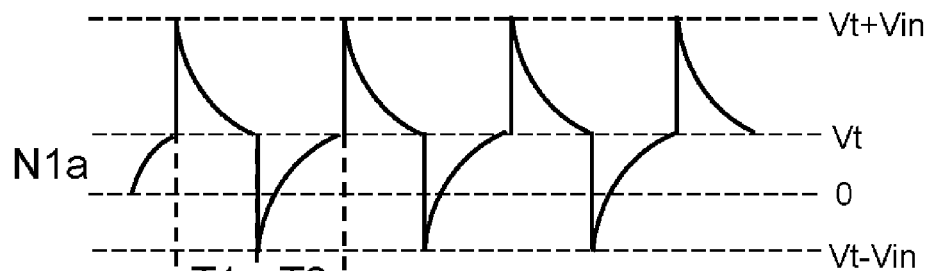
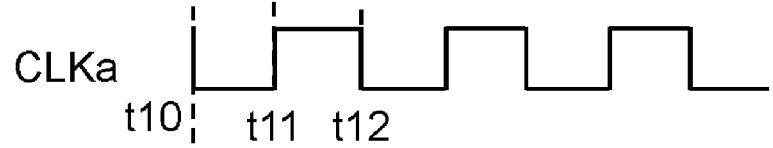
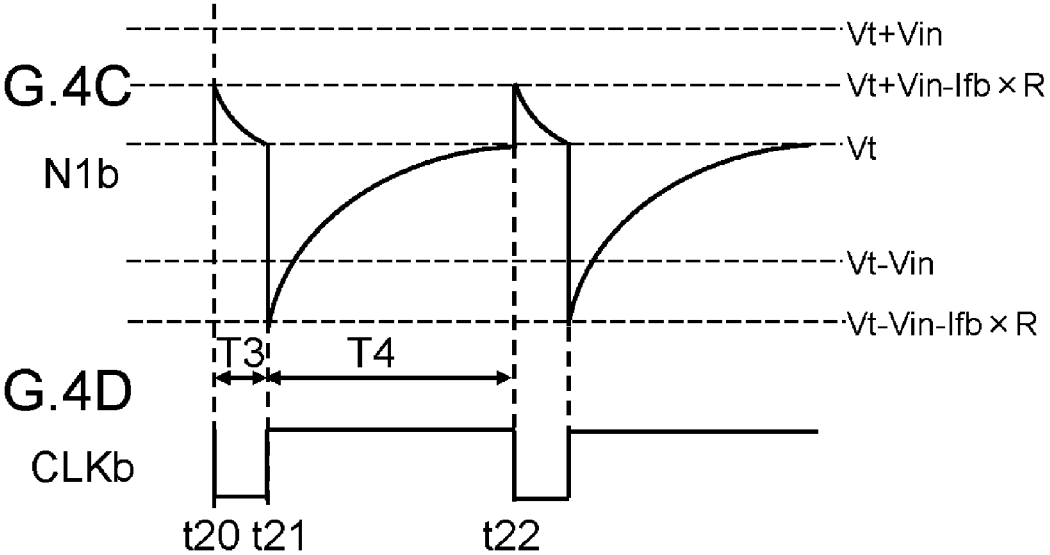

CHARGE PUMP CIRCUIT

CROSS-REFERENCE TO RELATED APPLICATIONS

This application is based on Japanese Patent Application No. 2015-69122 filed on Mar. 30, 2015, the contents of which are hereby incorporated by reference.

BACKGROUND OF THE INVENTION

1. Field of the Invention

The present invention relates to a charge pump circuit that raises a voltage by use of a combination of a capacitor and a switch.

2. Description of Related Art

A charge pump circuit is used, for example, as a voltage raising circuit (voltage step-up circuit) in a non-volatile storage device or a DC/DC switching regulator. In particular in recent years, as mobile devices such as smartphones and notebook personal computers are increasingly widespread, circuits used in such mobile devices are required to be compact and power-saving. A charge pump circuit, which achieves voltage raising without using an inductor, is suitable for size reduction.

As a so-called high-side switching device, that is, a switching device that is arranged on the supply line side of a DC/DC switching regulator, either a PMOS transistor or an NMOS transistor, for instance, is commonly used. A PMOS transistor has the advantage of comparatively easy gate voltage control, but has the disadvantage of requiring a larger area than an NMOS transistor to obtain comparable electrical characteristics, leading to higher production cost. Moreover, a low ON-state resistance, which is difficult to achieve with a PMOS transistor, can be achieved with an NMOS transistor with about one-third of the area that would be required with a PMOS transistor, leading to reduced production cost. However, using an NMOS transistor as a high-side switching device requires, to drive its gate, a voltage raising circuit such as a charge pump circuit or a bootstrap circuit; inconveniently, this results in increased current consumption and a higher withstand voltage in transistors.

FIG. 9 is a diagram illustrating the basic operation of a commonly known charge pump circuit. The charge pump circuit 100 is composed of a switching device SW, which is an NMOS transistor, and a voltage raiser 2. The switching device SW has a drain D, a source S, and a gate G. An input voltage vin is supplied to the source S of the switching device SW and to an input terminal Ti of the voltage raiser 2. The input voltage vin is supplied also to the source S of the switching device SW. From a raised output terminal TCP of the voltage raiser 2, a raised output voltage vcp which is higher than the input voltage vin by the threshold voltage Vt of the switching device SW is output, and the raised output voltage vcp is applied to the gate G of the switching device SW. The raised output voltage vcp is a voltage that is higher than the input voltage vin by 5 V to 6 V. For example, when the input voltage vin is set at 19 V, the raised output voltage vcp is set at, for example, 25 V (19 V+6 V=26 V). Thus, the switching device SW can be reliably brought into an ON state. This means that, in a case where the switching device SW is an NMOS transistor, a voltage that is higher than the input voltage vin by several volts has to be applied to its gate. Thus, using an NMOS transistor on the supply line side, on one hand, provides benefits as mentioned above but, on the other hand, leaves problems in terms of how to reduce power consumption and how to increase the switching device's withstand voltage.

As charge pump circuits, there have conventionally been proposed various configurations to suit different purposes. One known for power saving is seen in, for example, Japanese Patent Application Published No. 2001-112239 (hereinafter referred to as Patent Document 1). According to Patent Document 1, while the frequency of a clock fed to the charge pump circuit is constant, the raised voltage is controlled properly. To that end, when the output voltage of the charge pump circuit is lower than the desired voltage, a first or second clock starts to be supplied, and when the output voltage is higher than the desired voltage, the first or second clock stops being supplied.

According to Japanese Patent Application Publication No. 2002-233135 (hereinafter referred to as Patent Document 2), for efficient power consumption, there is provided a variable frequency generator for varying the frequency of an input signal to the charge pump circuit. Thus, variation in current load can be coped with properly by varying the frequency of an oscillator.

According to Japanese Patent Application Publication No. H11-328973 (hereinafter referred to as Patent Document 3), a semiconductor storage device is provided that operates with reduced power consumption. To that end, in a semiconductor storage device having a ring oscillator and a voltage raising circuit, the ring oscillator is operated at a short oscillation period until the raised voltage is reached, and the ring oscillator is operated slower, at a short oscillation period, after the completion of voltage raising.

According to Japanese Patent Application Publication No. 2008-124852 (hereinafter referred to as Patent Document 4), a charge pump circuit is provided that operates with lower power consumption. To that end, there is provided an oscillation circuit for supplying a clock signal, and the oscillation circuit has a current generation circuit that controls a ring oscillator having inverters connected in a ring formation and the current passing through the inverters so as to decrease the frequency of the clock signal as a supplied voltage increases.

However, according to Patent Document 1, when the output voltage is higher than the desired voltage, stopping the supply of the clock may cause a large variation in the output voltage, possibly producing an undesired large ripple.

According to Patent Document 2, when the load is heavy, the oscillation frequency is increased and, when the load is light, the oscillation frequency is decreased. Here, if, already at an early stage, the output current is high, that is, the load is heavy, then, already at an early stage, the oscillation frequency is high and accordingly the output voltage is high. This tends to cause a vicious cycle in which a rise in the output voltage results in a rise in the output current, and hence a rise in the oscillation frequency. Thus, the oscillator operates at the maximum frequency all the time, leading to high power loss.

According to Patent Document 3, the period of the clock is varied by varying the number of inverters in the ring oscillator which generates the clock. This requires as many switching devices as the number of inverters that need to be varied. Inconveniently, providing a number of switching devices complicates the circuit for controlling those switching devices.

According to Patent Document 4, controlling the ring oscillator and the current passing through the inverters requires a current generation circuit that decreases the current as the supplied voltage increases. Inconveniently, this requires a somewhat complicated circuit and, as the number of stages of inverters increases, accordingly increased current adjustment accuracy.

SUMMARY OF THE INVENTION

In view of the above-mentioned inconveniences found by the present inventor, an object of the present invention is to provide a charge pump circuit that allows reduction in power consumption with a comparatively simple circuit configuration.

According to one aspect disclosed herein, a charge pump circuit includes: a clock generator configured to generate a clock signal whose frequency varies between a first frequency and a second frequency at least one digit lower than the first frequency; a voltage raiser configured to generate a raised output voltage higher than a supplied input voltage by using the clock signal; a switching device receiving at a control electrode thereof the raised output voltage, the switching device receiving at a first principal electrode thereof first input supply power, the switching device yielding at a second principal electrode thereof first output supply power; and a clock generator controller configured to switch the frequency of the clock signal from the first frequency to the second frequency when the raised output voltage reaches a predetermined value or when a load current through the first or second principal electrode of the switching device exceeds a predetermined value.

According to another aspect disclosed herein, the clock generator includes: a ring oscillator having inverters or differential amplifiers or a combination of both connected in a ring formation; and a CR oscillator including a resistor and a capacitor provided in connection paths in the ring oscillator. The first end of the resistor and the first end of the capacitor are connected together to the input of the first-stage inverter of the inverters connected in the ring formation. The second end of the resistor is connected to an output of an odd-numbered-stage inverter of the inverters connected in the ring formation, the second end of the capacitor is connected to the output of an even-numbered-stage inverter of the inverters connected in the ring formation, and the output of the clock generator controller is connected to the input side of the first-stage inverter.

Other features, elements, steps, benefits, and characteristics of the present invention will become clearer with reference to the following description of preferred embodiments thereof in conjunction with the accompanying drawings.

BRIEF DESCRIPTION OF THE DRAWINGS

FIGS. 3A, 3B, 3C and 3D are time charts of the first embodiment shown in FIGS. 1 and 2;

FIGS. 4A, 4B, 4C and 4D are diagrams showing signal waveforms observed at relevant nodes in a clock generator 1 used in the first embodiment shown in FIGS. 1 and 2, illustrating shifts in the frequency of the clock signal CLK;

DETAILED DESCRIPTION OF PREFERRED EMBODIMENTS

Embodiment 1

Figure 1:
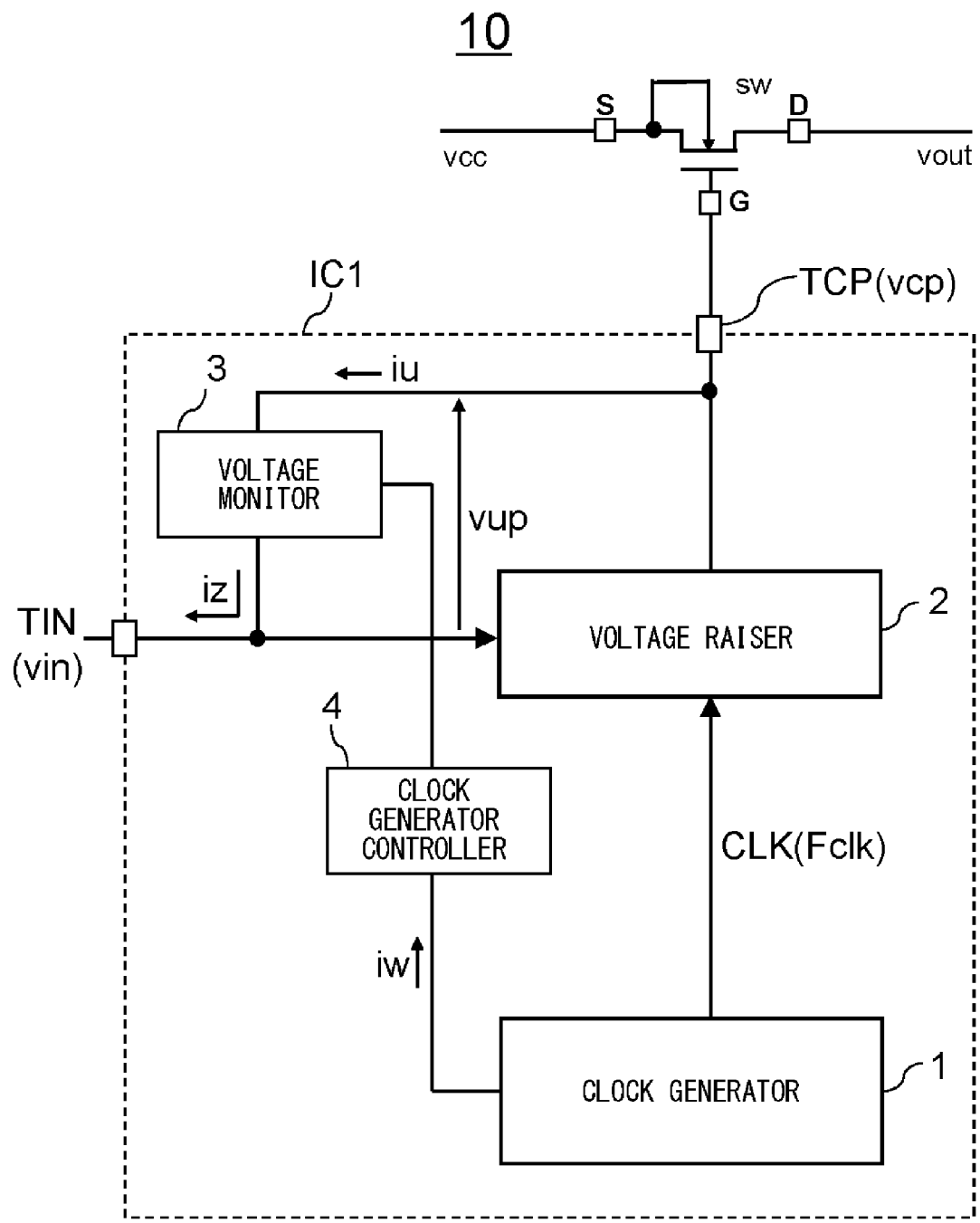
FIG. 1 is a block diagram of a charge pump circuit according to a first embodiment of the present invention.

FIG. 1 shows a charge pump circuit according to a first embodiment (Embodiment 1) of the present invention, and is a block diagram illustrating, especially, the concept of a charge pump circuit according to the present invention. The charge pump circuit 10 according to Embodiment 1 includes, as blocks integrated into an integrated circuit IC1, a clock generator 1, a voltage raiser 2, a voltage monitor 3, and a clock generator controller 4, and further includes, as a block provided outside the integrated circuit IC1, a switching device SW. The charge pump circuit 10 also includes an input terminal TIN and a raised output terminal TCP for establishing electrical connection with outside the circuit.

The clock generator 1 generates a clock signal CLK which is used by the voltage raiser 2 in the subsequent stage to raise an input voltage vin. The clock signal CLK is generated by an oscillator incorporated in the clock generator 1 (the oscillator being, for example, a CR oscillator, or a ring oscillator having inverters or differential amplifiers connected in a ring formation, or a combination of both). The clock signal CLK is so controlled that it has a high frequency Fclk until the raised voltage is reached and has a low frequency Fclk after the completion of voltage raising. The frequency Fclk of the clock signal CLK is controlled automatically by the voltage monitor 3 and the clock generator controller 4. How it is controlled specifically will be discussed later.

The voltage raiser 2 operates by using the clock signal CLK output from the clock generator 1, and outputs a raised output voltage vcp based on the frequency (period) Fclk of the clock signal CLK to the raised output terminal TCP. The raised output voltage vcp has a voltage which is the sum of the input voltage vin supplied to the input terminal TIN and a added-on voltage vup added on by the voltage raiser 2: vcp=vin+vup.

The voltage monitor 3 monitors the added-on voltage vup, that is, the voltage difference between the input voltage vin supplied to the input terminal TIN and the raised output voltage vcp produced by the voltage raiser 2. When there is a predetermined voltage difference between the input voltage vin and the raised output voltage vcp, the voltage monitor 3 detects it and delivers a detection output to the clock generator controller 4 in the subsequent stage.

The raised output voltage vcp output from the raised output terminal TCP is applied to a control electrode G of the switching device SW. To a first principal electrode S of the switching device SW, first input power vcc is supplied. On the other hand, to a second principal electrode D of the switching device SW, first output power vout approximately equal to the first input power vcc is output when the switching device SW is ON according to the level of the raised output voltage vcp applied to the control electrode G.

In one embodiment of the present invention, the voltage monitor 3, though essentially a circuit for monitoring the raised output voltage vcp, monitors the current through the voltage monitor 3. This is because the current through the voltage monitor 3 governs the circuit operation of the clock generator controller 4 in the subsequent stage. The current that passes from the raised output terminal TCP to the voltage monitor 3 is indicated by the sign iu, and the current that passes from the voltage monitor 3 to the input terminal TIN is indicated by the sign iz.

According to the detection output received from the voltage monitor 3, the clock generator controller 4 controls the frequency Fclk of the clock signal CLK generated by the clock generator 1. In one embodiment of the present invention, the clock generator controller 4 draws in a frequency control current iw from the clock generator 1. Needless to say, the clock generator controller 4 may instead pass a frequency control current into the clock generator 1. While a specific circuit configuration of the clock generator controller 4 will be discussed later, the circuit can adopt, for example, a voltage-current conversion circuit, a voltage-voltage conversion circuit, a current-voltage conversion circuit, a current-current conversion circuit, or the like. Irrespective of whether the action of the clock generator controller 4 on the clock generator 1 is of a current control type or a voltage control type, the clock generator controller 4 is required to adjust and control the frequency Fclk of the clock signal CLK generated by the clock generator 1.

The added-on voltage vup, the currents iu and iz, and the frequency control current iw are so controlled as to meet a predetermined relationship. When the added-on voltage vup is lower than a predetermined value, for example when vup<6 V, the currents iu and iz and the frequency control current iw are all set at approximately zero. On the other hand, when the added-on voltage vup is equal to or higher than the predetermined value, for example when vup≥6 V, the currents iu and iz and the frequency control current iw are set at predetermined current values or in predetermined current value ranges. The relationship between the levels of the currents iu and iz is set as necessary. The two currents may have equal levels or different levels. The level of the frequency control current iw drawn from the clock generator 1 into the clock generator controller 4 is determined according to the control range of the frequency Fclk of the clock signal CLK generated by the clock generator 1. From the perspective of power saving, the frequency control current iw is set at, for example, a value one digit or two digits lower than the currents iu and iz, specifically at several microamperes to ten and several microamperes.

Figure 2:
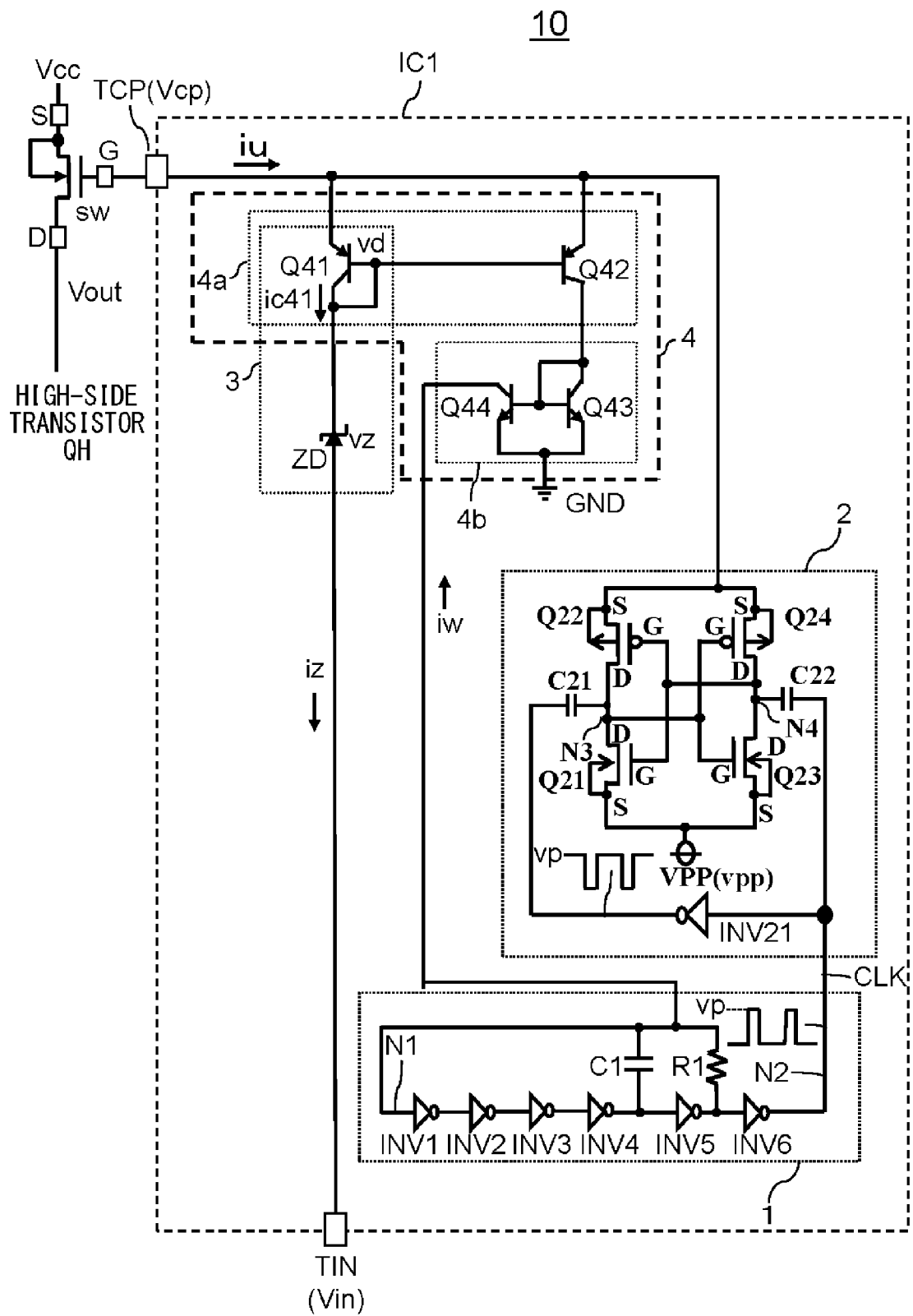
FIG. 2 is a diagram showing a specific circuit configuration of FIG. 1.

FIG. 2 is a diagram showing a specific circuit configuration according to Embodiment 1, shown in FIG. 1, of the present invention. Such parts as find their counterparts in FIG. 1 are identified by common reference signs, and no overlapping description will be repeated.

The clock generator 1 has a circuit function as a clock signal generator that outputs a clock signal CLK. For example, in one circuit configuration of the clock generator 1, inverters are connected in a ring formation, and a capacitor and a resistor are connected between predetermined paths. The inverters are configured as so-called CMOS inverters in which the gates of PMOS and NMOS transistors are connected together while their principal conducting paths are connected in series. The clock generator 1 used in the present invention is typically configured as a CR oscillator or a ring oscillator. A ring oscillator is composed of an odd number of NOT circuits. As NOT circuits, inverters as shown in FIG. 2 may be used, or unillustrated differential amplifiers may be used as inverters.

The clock generator 1 shown in FIG. 2 is composed of inverters INV1 to INV5 connected in a ring formation, a capacitor C1, a resistor R1, and an inverter INV6. The output of each of the inverters INV1 to INV5 is connected to the input of the inverter in the subsequent stage. Specifically, the outputs of the inverters INV1, INV2, INV3, and INV4 are connected to the inputs of the inverters INV2, INV3, INV4, and INV5 respectively. The output of the inverter INV5, which is the last of an odd number of stages, is fed back, via the resistor R1, to the input of the inverter INV1 in the first stage. The common node between the resistor R1 and the capacitor C1, to which the input of the inverter INV1 is also connected, is identified as a node N1. The input of the inverter INV1 and the output of the inverter INV5 have opposite phases, and thus the resistor R1 serves as a negative feedback path. Accordingly, at the output of the inverter INV5, the input of the inverter INV1 is constantly drawn into the opposite voltage. The capacitor C1 is connected between the output of the inverter INV4 and the input of the inverter INV1. The output of the inverter INV4 and the input of the inverter INV1 have the same phase. Thus, the capacitor C1 serves as a positive feedback path. Having a circuit configuration as described above, the clock generator 1 outputs the clock signal CLK stably. Incidentally, the inverter INV6 is not directly involved in a CR oscillator or a ring oscillator; it is provided for polarity matching with the subsequent stage, and to serve as a buffer. The output of the clock generator 1 is identified as a node N2.

The frequency Fclk (or period) and the pulse width of the clock signal CLK output from the node N2, which is the output of the clock generator 1, can be determined by adjusting the delay time through the inverters INV1 to INV5 and the charge/discharge characteristics of the capacitor C1 and the resistor R1.

The clock generator 1 shown in FIG. 2 is a well-known CR oscillator, but is, in the present invention, distinctively characterized in that the output of the clock generator controller 4 is coupled to the node N1, which is the common node among the input of the inverter INV1, the capacitor C1, and the resistor R1. Thus, the clock generator controller 4 draws in the frequency control current iw from the clock generator 1 via the node N1. Moreover, with this configuration, it is possible to control, so as to vary, the frequency Fclk, pulse duty ratio, and pulse width of the clock signal CLK by controlling the charge/discharge characteristics of the capacitor C1 and the resistor R1. The details will be given later.

The voltage raiser 2 serves to raise the input voltage vin supplied to the input terminal TIN to a predetermined level by using the clock signal CLK output from the clock generator 1. The voltage raiser 2 includes NMOS transistors Q21 and Q23, PMOS transistors Q22 and Q24, capacitors C21 and C22, and an inverter INV21. The gates G of the transistors Q21 and Q22 are connected together to serve as an input part (a node N4) of a first CMOS inverter. The drains D of the transistors Q21 and Q22 are connected together to serve as an output part (a node N3) of the first CMOS inverter. The gates G of the transistors Q23 and Q24 are connected together to serve as an input part (the node N3) of a second CMOS inverter. The drains D of the transistors Q23 and Q24 are connected together to serve as an output part (the node N4) of the second CMOS inverter. The circuit configuration composed of the first and second CMOS inverters constitute a well-known latch circuit in which each CMOS inverter feeds back its output to the other's input.

Between the node N3 and the output of the inverter INV21, the capacitor C21 is connected. Between the node N4 and the node N2, the latter being the input terminal of the inverter INV21, the capacitor C22 is connected.

The sources of the transistors Q21 and Q23 are connected together, and are supplied with a reference input voltage vpp from a reference input power source VPP. The reference input voltage vpp can be said to be a second reference voltage in the voltage raiser 2. The voltage raiser 2 produces a voltage that is higher than the reference input voltage vpp by the added-on voltage vup. With the add-on losses across the capacitors C21 and C22 ignored, the added-on voltage vup is determined by the peak value vp of the clock signal CLK. Accordingly, the voltage raiser 2 outputs, on the source S side of the transistors Q22 and Q24, a voltage having the peak value vp added on the reference input voltage vpp, specifically a voltage (vpp+vp).

The clock signal CLK output from the node N2 is applied, via the inverter INV21 and the capacitor C21, to the node N3, that is, the gates G of the transistors Q23 and Q24 which constitute the second CMOS inverter. The clock signal CLK is also applied, via the capacitor C22, to the node N4, that is, the gates of the transistors Q21 and Q22 which constitute the first CMOS inverter. When the clock signal CLK is at high level H, the node N4 too is at high level H, and the node N3 is at low level L. Accordingly the transistors Q21 and Q24 are ON, and the transistors Q22 and Q23 are OFF.

When the clock signal CLK is at high level H, the output of the inverter INV21 is at low level L, and the transistor Q21 is ON; thus, the capacitor C21 is charged until the node N3 side electrode of the capacitor C21 rises up to the reference input voltage vpp supplied to the reference power source VPP. On the other hand, when the clock signal CLK is at low level L, the transistor Q23 is ON; thus, capacitor C22 is charged until the node N4 side electrode of the capacitor C22 rises up to the reference input voltage vpp supplied to the reference power source VPP.

When the clock signal CLK shifts from high level H to low level L, the transistors Q21 and Q24 turn from ON to OFF. When the clock signal CLK is at low level L, the electrode of the capacitor C21 that is connected to the output of the inverter INV21 is raised up to the peak value vp of the clock signal CLK, and the potential at node N3 is raised up to the potential (vpp+vp) which is the sum of the previously charged potential vpp and the peak value vp. The raised voltage (vpp+vp) is output, via the transistor Q22, to the raised output terminal TCP.

When the clock signal CLK shifts from low level L to high level H, the transistors Q23 and Q22 turn from ON to OFF. When the clock signal CLK is at high level H, the node N4 side electrode of the capacitor C22 that is connected to the input terminal (node N2) of the inverter INV21 is raised up to the peak value vp of the clock signal CLK, and the potential at the node N4 is raised up to the potential (vpp+vp) which is the sum of the previously charged potential vpp and the peak value vp. The raised voltage (vpp+vp) is output, via the transistor Q24, to the raised output terminal TCP.

The voltage raiser 2, which is composed of the transistors Q21 and Q24, the capacitor C21 and C22, and the inverter INV21, can always, irrespective of whether the clock signal CLK is at high level H or at low level L, yield a voltage raised up to the level of the peak value vp of the clock signal CLK added on the reference input voltage vpp. Accordingly, with the reference input voltage vpp and the peak value vp of the clock signal CLK appropriately set, the voltage raiser 2 can yield a voltage raised up to a desired level.

The voltage monitor 3 has an extremely simple circuit configuration composed of a Zener diode ZD and a diode-connected transistor Q41. The transistor Q41 is, for example, a pnp bipolar transistor. The voltage monitor 3 is connected between the input terminal TIN and the raised output terminal TCP; it produces a predetermined voltage difference between the two terminals, and also monitors the voltage difference (vcp–vin) between the two terminals. The monitoring of the voltage difference here is achieved on the basis of whether or not there is a current iz through the Zener diode ZD (a breakdown current of the Zener diode). Specifically, when the current iz equals approximately zero, the voltage difference between the input terminal TIN and the raised output terminal TCP has not yet reached a predetermined level; when the current iz exceeds a predetermined level, a predetermined voltage difference appears between the two terminals. In other words, when a desired raised output voltage vcp (=vin+vup) is output to the raised output terminal TCP, a current iz passes through the transistor Q41 and the Zener diode ZD. Thus, in one embodiment of the present invention, the voltage monitor 3 is characterized in that it not only monitors the level of the voltage difference between the raised output voltage vcp and the input voltage vin but also determines the added-on voltage vup.

As mentioned above, the monitoring of the added-on voltage vup by the voltage monitor 3 is achieved based on whether or not there is a current iz through the Zener diode ZD. Now, how a desired added-on voltage vup is set will be described. The added-on voltage vup is determined by the emitter-base forward voltage vd of the transistor Q41 and the breakdown voltage vz of the Zener diode ZD. The added-on voltage vup is given by vup=vz+vd. Suppose vz=5.3 V and vd=0.7 V, then vup=5.3+0.7=6.0 V. The level of the added-on voltage vup is not limited to 6.0 V, but can be set at a desired level by combining together constant-voltage devices (e.g., diodes). For example, in a case where the vup has to be set at about 12 V, two Zener diodes can be connected in series. For another example, in a case where the added-on voltage vup has to be set at about 14 V, two Zener diodes and three diodes (each with a forward voltage drop of 0.7 V) can be connected in series. For yet another example, in a case where the added-on voltage vup has to be set at 6 V or less, several diodes as constant-voltage devices can be connected in series, with no Zener diode included. Incidentally, the breakdown voltage vz of a Zener diode ZD can be controlled by controlling the cathode- or anode-side dopant density.

The clock generator controller 4 is composed of a first current mirror circuit 4a and a second current mirror circuit 4b. The first current mirror circuit 4a is composed of pnp bipolar transistors Q41 and Q42, and the second current mirror circuit 4b is composed of npn bipolar transistors Q43 and Q44. These transistors may instead be PMOS transistors and NMOS transistors respectively. The transistor Q41 in the first current mirror circuit 4a is, as mentioned earlier, part of the voltage monitor 3. The transistor Q41 thus plays an important role to directly couple the voltage and current detected by the voltage monitor 3 with the circuit operation of the clock generator controller 4. Specifically, the current through the transistor Q41 is the source of transfer that determines the currents through the first and second current mirror circuits 4a and 4b, and is hence the source of generation of the frequency control current iw for controlling the clock signal CLK generated by the clock generator 1.

As mentioned earlier, the current through the transistor Q41 approximately equals the current iz through the Zener diode ZD. The current iz is determined by the impedance between the raised output terminal TCP and the input terminal TIN. Thus, an excessively low impedance may cause an overcurrent through the Zener diode ZD. To avoid that, a resistor with a comparatively low resistance value of several tens of ohms to several hundred ohms may be connected between the Zener diode ZD and the input terminal TIN to limit the current iz through the Zener diode ZD.

The collector current ic41 through the transistor Q41 approximately equals the current iz, and serves as the source of transfer of the current through the transistor Q42. Here, suppose the transistors 41 and 42 are the same size, then the current through the transistor Q42 equals the collector current ic41 (≈iz). The collector current through the transistor Q42 is fed to the transistor Q43. The current through the transistor Q43 is transferred to the transistor Q44, and thus, suppose the transistors Q44 and Q43 are the same size, then equal currents pass through the transistors Q44 and Q43. The current through the collector of the transistor Q44 passes from the clock generator 1 to the clock generator controller 4, becoming the frequency control current iw earlier mentioned.

In any case, the frequency control current iw is determined by the current iz through the Zener diode ZD, and the current ratio between the two is adjusted by the first current mirror circuit 4a, composed of the transistors Q41 and Q42, and the second current mirror circuit 4b, composed of the transistors Q43 and Q44. Incidentally, a comparatively high current ratio between the two can be easily achieved by connecting a resistive element between the emitter of one of the transistors Q41 and Q42 and the raised output terminal TCP, or by connecting a resistive element between the emitter of one of the transistors Q43 and Q44 and a ground potential GND.

When the frequency control current iw is drawn in from the node N1 of the clock generator 1, by the frequency control current iw, the waveform and frequency (period) of the signal appearing at the node N1 are controlled, and eventually the frequency and pulse duty ratio of the clock signal CLK output from the node N2, which is the output of the clock generator 1, are controlled.

The clock generator controller 4 shown in FIG. 2 is configured to draw in the frequency control current iw from the clock generator 1; instead, the clock generator controller 4 may be configured to pass a frequency control current from the clock generator controller 4 into the clock generator 1. In either case, the circuit configuration is of a current control type; instead, a circuit configuration of a voltage control type may be adopted. Specifically, by use of, for example, a voltage-voltage converter that converts the added-on voltage vup monitored by the voltage monitor 3 into a predetermined voltage, the supply voltage to the inverters constituting the clock generator 1, or the voltage applied to the node N1, may be controlled.

The clock signal CLK, of which the frequency and pulse duty ratio are controlled by the frequency control current iw, serves as a drive signal for the charge pump operation performed by the voltage raiser 2, and the raised output voltage vcp produced by the voltage raiser 2 is output to the source S side of the transistors Q22 and Q24 (to the raised output terminal TCP). The voltage monitor 3 includes the first current mirror circuit composed of the transistors Q41 and Q42 and the second current mirror circuit composed of the transistors Q43 and Q44. The first and second current mirror circuits are connected in series. The transistors Q41 and Q42 are arranged on the input and output sides, respectively, of the first current mirror circuit. The transistors Q43 and Q44 are arranged on the input and output sides, respectively, of the second current mirror circuit. The output side of the first current mirror circuit is connected to the input side of the second current mirror circuit. Thus, the first and second current mirror circuits are connected in series.

Figure 7:
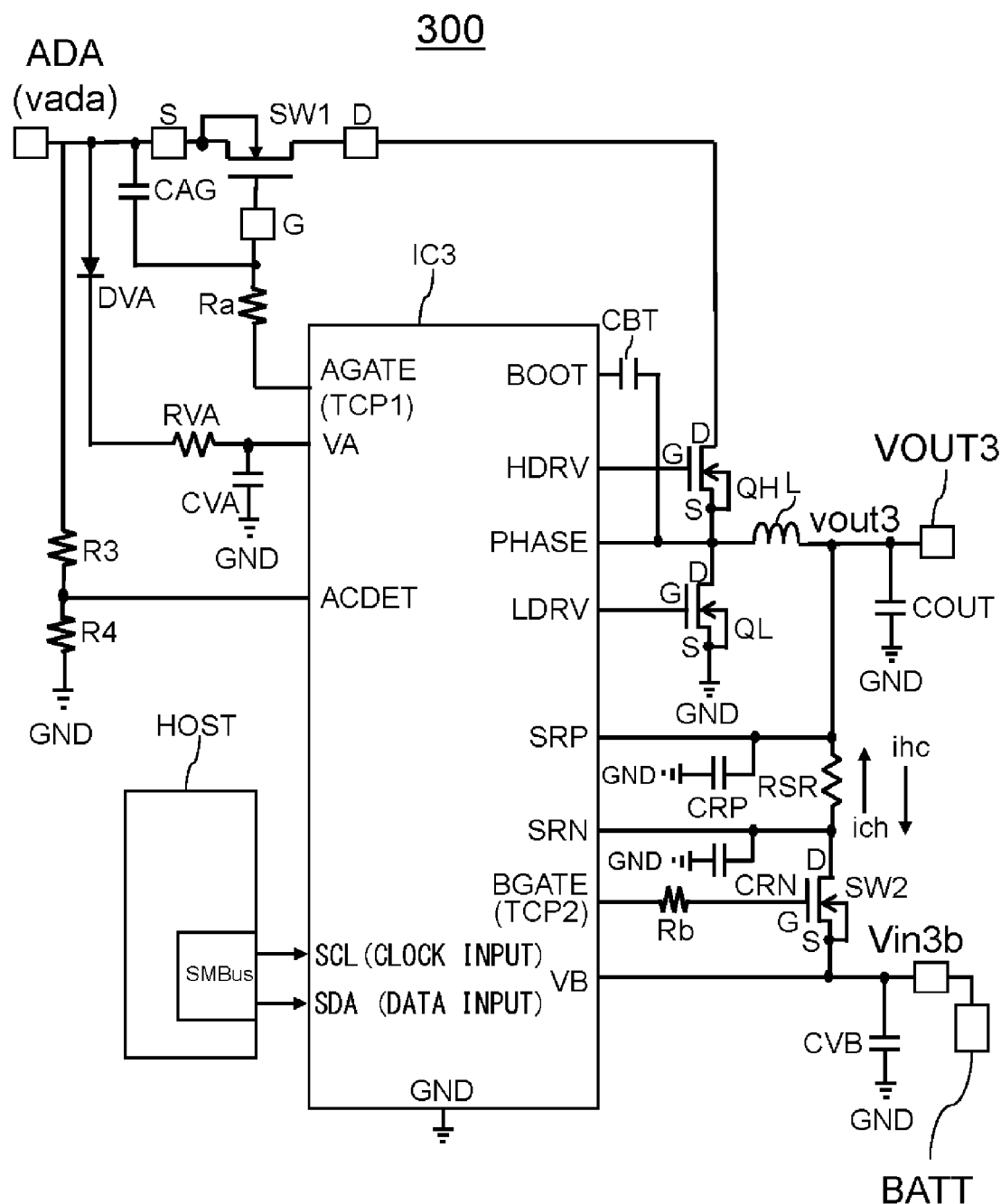
FIG. 7 is a diagram showing an application circuit in which a charge pump circuit according to the present invention is applied to a SMSbus.

In FIG. 2, the raised output voltage vcp output to the raised output terminal TCP is applied to the control electrode G of the switching device SW. Here, the switching device SW is provided separately from a high-side transistor included in a DC/DC switching regulator. The interconnection between the switching device SW and the high-side transistor is shown in FIG. 7, which will be described later, and, put briefly, their interconnection is as follows: the switching device SW and the high-side transistor are connected in series, and this serial connection is connected between the supply power and a low-side transistor. A specific circuit configuration is shown in FIG. 7, which will be described later.

FIG. 3 is a time chart illustrating the operation of Embodiment 1 shown in FIG. 2. FIG. 3(a) shows the raised output voltage vcp output from the voltage raiser 2. Suppose the input voltage vin is constantly supplied, then before time point t1, at which voltage-raising operation starts, the raised output voltage vcp of the voltage raiser 2 equals the input voltage vin at the input terminal VIN. Before time point t1, the clock signal CLK is not fed to the voltage raiser 2. Between time points t1 and t2, the voltage raiser 2 is fed with the clock signal CLK and performs voltage-raising operation, that is, charge pump operation. At time point t2, the raised output voltage vcp reaches a level that is higher than the input voltage vin at the input terminal VIN by the added-on voltage vup, and the raised output voltage vcp thereafter remains at the level (vin+vup).

FIG. 3(b) shows the transition of the current iu passing from the raised output terminal TCP to the voltage monitor 3. In Embodiment 1, when the voltage difference (vcp−vin) between the raised output voltage vcp output from the raised output terminal TCP and the input voltage vin at the input terminal VIN is lower than a set voltage set in the voltage monitor 3, that is, before time point t2, almost no current passes, and thus the current iu approximately equals zero. At the time point at which the voltage difference between the raised output voltage vcp and the input voltage vin exceeds the set voltage in the voltage monitor 3, that is, at time point t2, the current iu starts to pass and soon settles at a control current iun. The time point at which the current iu settles at the control current iun may be time point t2 or immediately before time point t2. The current iu may take a certain length of time to reach the control current iun; the transition does not need to be abrupt, because it does not much affect reduction in power consumption.

FIG. 3(c) shows the frequency control current iw which the clock generator controller 4 draws in from the clock generator 1. The frequency control current iw may be of the same order as the current iu, or one digit or two digits lower than the current iu, or even one digit or two digits higher than the current iu. In any case, the current value iwn of the current iw is determined as appropriate according to the so-called control characteristics required of the clock generator 1, such as the control range of the frequency of the clock signal CLK.

FIG. 3(d) shows the clock signal CLK generated by the clock generator 1. At time point t1, the clock signal CLK starts to be generated, and the voltage raiser 2 starts voltage-raising operation. During the period from time point t1 to time point t2, at which the difference between the raised output voltage vcp and the input voltage vin reaches the set voltage in the voltage monitor 3, the frequency Fclk of the clock signal CLK equals a first frequency Fclk1, which is comparatively high. That is, the clock signal CLK oscillates fast. After time point t2, the frequency Fclk of the clock signal CLK is reduced to a second frequency Fclk2, which is lower than the first frequency Fclk1. The clock signal CLK now oscillates slow, and here the pulse duty ratio too is set lower (see time points t3 and t4).

In Embodiment 1, during time points t1 and t2, the frequency control current iw equals zero, and thus the clock signal CLK oscillates at the first frequency Fclk1, which is the maximum frequency at which the clock generator 1 can oscillate. After time point t2, the frequency of the clock signal CLK is switched to the second frequency Fclk2, which depends on the frequency control current iw. Specifically, when the frequency control current iw is low, the frequency Fclk of the clock signal CLK is high; conversely, when the frequency control current iw is high, the frequency Fclk of the clock signal CLK is low. Moreover, as is generally known, the higher the frequency Fclk of the clock signal CLK by which the voltage raiser 2 is driven, the higher the driving performance of the voltage raiser 2, and thus the higher the voltage value of the raised output voltage vcp.

FIG. 4 schematically shows the signal waveform appearing at the node N1 in the clock generator 1. In FIG. 4, the inversion threshold value of the inverters INV1 to INV5 is represented by Vt, the capacitance value of the capacitor C1 is represented by C, and the resistance value of the resistor R1 is represented by R. Here, the inverters INV1 to INV5 are each configured as a CMOS inverter composed of a PMOS transistor and an NMOS transistor. Here, it is assumed that the threshold values Vtn and Vtp of the NMOS and PMOS transistors are negligible as compared with the inversion threshold value Vt of the inverter.

FIG. 4(a) schematically shows the signal waveform appearing at the node N1 in a state where the frequency Fclk of the clock signal CLK generated by the clock generator 1 is not controlled, that is, when the frequency control current iw which the clock generator controller 4 draws in from the clock generator 1 equals zero and Fclk=Fclk1. The potential VN1 at the node N1 between time points t10 and the t11, during which period the capacitor C1 is discharged, is given by formula (1) below.

$$VN1=(Vt+Vin) \times e^{(-t/CR)} \quad (1)$$

Between time points t12 and t13, that is, while the capacitor C1 is charged, the potential at node N1 is given by formula (2) below.

$$VN1=Vin-(2Vin-Vt) \times e^{(-t/CR)} \quad (2)$$

The period T1 after the output of the inverter INV1 is inverted until the capacitor C1 is discharged and the potential at the node N1 falls to Vt is given by formula (3) below.

$$T1=CR \times \ln\left[(Vin+Vt)/Vt\right] \quad (3)$$

On the other hand, the period T2 after the output of the inverter INV1 is inverted until the capacitor C1 is charged and the potential at the node N1 rises to Vt is given by formula (4) below.

$$T2=CR \times \ln\left[(2Vin-Vt)/(Vin-Vt)\right] \quad (4)$$

Here, the frequency Fclk (=Fclk1) of the clock signal CLK equals the reciprocal of the sum of the periods T1 and T2, and is thus given by formula (5) below.

$$Fclk=1(T1+T2) \quad (5)$$

Suppose, for the inversion threshold value Vt of the inverter, Vt=Vin/2, then the frequency Fclk of the clock signal CLK is given by formula (6) below.

$$Fclk=1/(2.2 \times CR) \quad (6)$$

Thus, the frequency Fclk of the clock signal CLK is determined by the time constant of the capacitor C1 and the resistor R1.

FIG. 4(b) shows the output of the clock generator 1 which is generated according to FIG. 4(a), that is, the clock signal CLKa output from the node N2. The clock signal CLKa schematically shown here has periods T1 and T2 approximately equal to those generated according to the CR integration waveform shown in FIG. 4(a), and thus has a comparatively high frequency.

FIG. 4(c) shows the signal waveform that appears at the node N1 in a state where the frequency of the clock signal CLK is controlled, that is, when the clock generator controller 4 draws in the current iw from the clock generator 1 and Fclk=Fclk2. The period after the output of the inverter INV1 is inverted until the potential at the node N1 falls from the peak to the inversion threshold value Vt is indicated as T3, and the period after the output of the inverter INV1 is inverted until the potential at the node N1 rises from the bottom to the inversion threshold value Vt is indicated as T4. It will be understood that the sum of the periods T3 and T4 shown in FIG. 4(c) is longer than the sum of the periods T1 and T2 shown in FIG. 4(a). The reason is that, as a result of the clock generator controller 4 drawing in the frequency control current iw from the clock generator 1, the voltage across the capacitor C1, which equals (Vin−iw×R), decreases. Substituting this level in formulae (3) and (4) noted above such that the frequency equals Fclk2 (the reciprocal of the sum of the periods T3 and T4) gives periods longer than those previously determined with the first frequency Fclk1, and thus the clock signal CLK has a lower frequency Fclk.

FIG. 4(d) shows the output of the clock generator 1 generated according to FIG. 4(c), that is, a clock signal CLKb output from the node N2. As will be understood from there, the clock signal CLKb has the sum of the periods T3 and T4 generated according to the CR integration waveform shown in FIG. 4(c); it thus has a lower frequency than that shown in FIG. 4(b) and a lower duty ratio.

Embodiment 2

Figure 5:
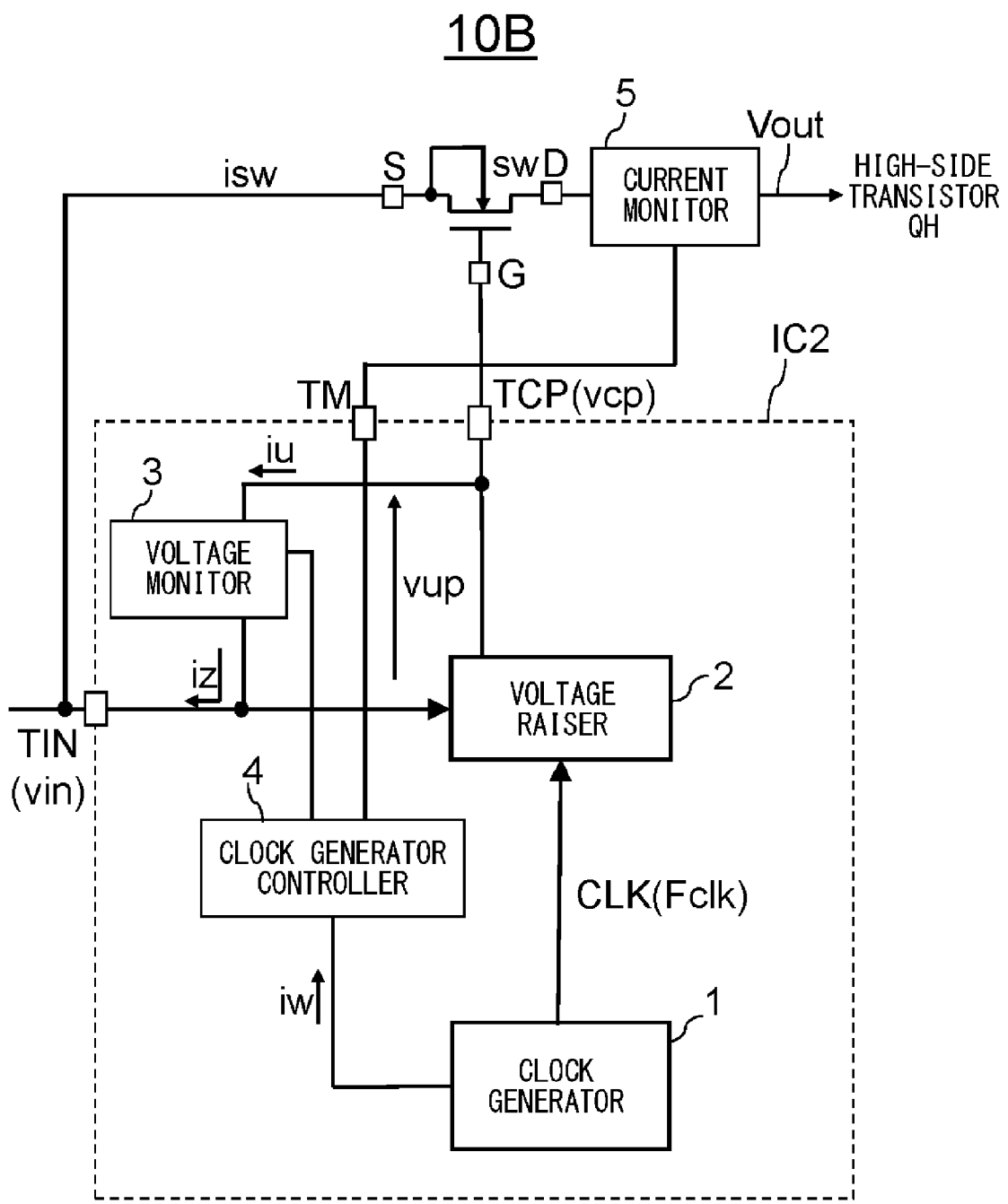
FIG. 5 is a block diagram of a second embodiment of the present invention.

FIG. 5 is a block diagram of a second embodiment (Embodiment 2) of the present invention. A charge pump circuit 10B here differs from the charge pump circuit 10 shown in FIG. 1, first, in that a current monitor 5 is provided on the second principal electrode D side of the switching device SW and, second, in that the output of the current monitor 5 is connected to the clock generator controller 4 via an external terminal TM. An integrated circuit IC2 shown in FIG. 5 differs from the integrated circuit IC1 shown in FIG. 1 in having the external terminal TM. The current monitor 5 may be provided on the first principal electrode S side of the switching device SW. The charge pump circuit 10 according to Embodiment 1 shown in FIGS. 1 and 2 achieves power saving by monitoring the voltage difference between the input voltage vin and the raised output voltage vcp, lowering the frequency of the clock signal CLK generated by the clock generator 1 when the voltage difference reaches a predetermined added-on voltage vup, and driving the voltage raiser 2 by using the clock signal CLK having the lower frequency. In other words, the charge pump circuit 10 according to Embodiment 1 is concerned not with the switching device SW but only with the circuit configuration in the stages leading to it.

By contrast, the charge pump circuit 10B shown in FIG. 5 achieves power saving by, in addition to operating like the charge pump circuit 10 according to Embodiment 1, additionally detecting the current isw through the switching device SW and performing such control as to lower the frequency Fclk of the clock signal CLK generated by the clock generator 1 when the current isw exceeds a predetermined value. The current isw through the switching device SW approximately equals the current through the high-side transistor QH in the DC/DC switching regulator; thus, control is performed such that power consumption is reduced also when there is a current exceeding a predetermined value or an overcurrent through the high-side transistor QH.

Although FIG. 5 shows a circuit configuration including both a current monitor 5 and a voltage monitor 3, in Embodiment 2, the voltage monitor 3 is not an essential element. This is because, by connecting the current monitor 5 to either of the conducting paths, namely the first principal electrode S and the second principal electrode D, of the switching device SW, it is possible to obtain the circuit function of the voltage monitor 3. That is, when the added-on voltage vup has reached a predetermined level, the switching device SW has the current isw. Moreover, by providing the current monitor 5, it is possible not only to obtain the circuit function of the voltage monitor 3 but also to obtain the benefit of being capable of monitoring the current isw through the switching device SW and the high-side transistor QH. The current monitor 5 monitors the current isw through the switching device SW, and controls the clock generator controller 4 according to the level of the monitored current isw; the clock generator controller 4 draws in the frequency control current iw from the clock generator 1, and controls the frequency Fclk and pulse duty ratio of the clock signal CLK.

Figure 6:
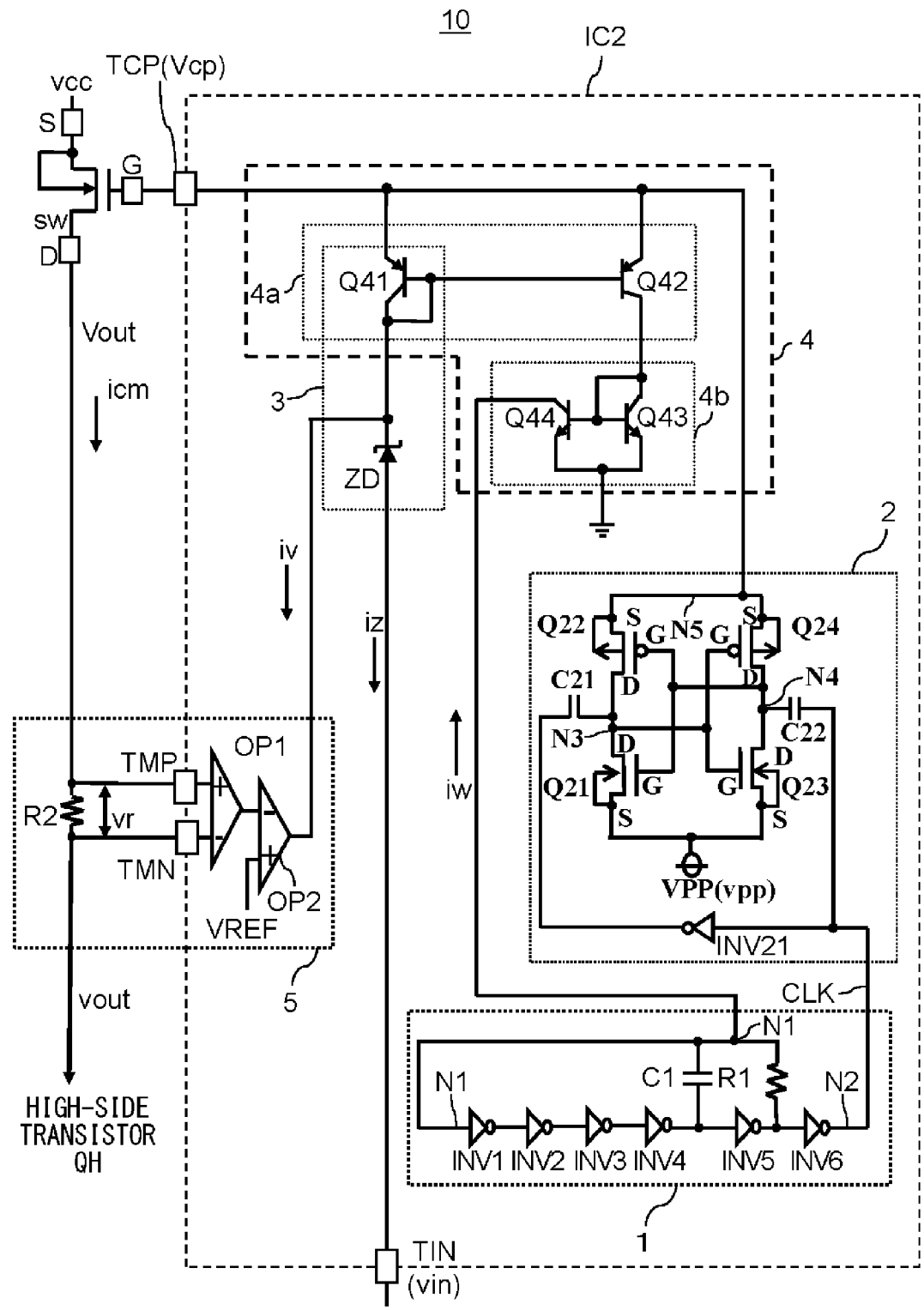
FIG. 6 is a diagram showing one circuit configuration used in the second embodiment shown in FIG. 5.

FIG. 6 is a diagram showing a specific circuit configuration of Embodiment 2 shown in FIG. 5. The current monitor 5 monitors the current icm through the switching device SW. The current monitor 5 is composed of a current detection resistor R2 and operational amplifiers OP1 and OP2. One end of the current detection resistor R2 is connected to the second principal electrode D of the switching device SW and to an external terminal TMP, and the other end of the current detection resistor R2 is connected to an external terminal TMN. To the external terminal TMN, an output voltage vout is output, which is applied to, for example, the high-side transistor QH arranged on the supply line side of the DC/DC switching regulator.

The external terminal TMP is connected to a non-inverting terminal of the operational amplifier OP1, and the external terminal TMN is connected to an inverting terminal of the operational amplifier OP1. The output of the operational amplifier OP1 is connected to an inverting terminal of the operational amplifier OP2, and a reference voltage VREF is fed to a non-inverting terminal of the operational amplifier OP2. The output of the operational amplifier OP2 is connected to the voltage monitor 3 and to the clock generator controller 4, specifically to the collector of the transistor Q41.

The current detection resistor R2 converts the current icm through the switching device SW into a voltage. The level of the current icm determines the voltage difference vr between the external terminals TMP and TMN. The voltage difference vr between them equals the resistance value r2 of the current detection resistor R2 multiplied by the current icm: vr=r2·icm.

The operational amplifier OP1 amplifies the voltage difference vr between the external terminals TMP and TMN. The amplification factor is set at, for example, 20 db to 40 db.

The operational amplifier OP2 compares the level of the voltage amplified by the operational amplifier OP1 with the reference voltage VREF. Based on the result of the comparison, the operational amplifier OP2 draws in a current iv from the clock generator controller 4 side. The current iv is at its minimum when the output of the operational amplifier OP2 is at high level H, and is at its maximum when the output the operational amplifier OP2 is at low level L. When the current iv is at its maximum, the clock generator controller 4 draws in the frequency control current iw from the clock generator 1 side, and so operates as to lower the frequency Fclk of the clock signal CLK.

In Embodiment 2 shown in FIGS. 5 and 6, the Zener diode ZD is not necessarily needed. This is because, in Embodiment 2, the voltage monitor 3 is not an essential element. Moreover, in Embodiment 2, the clock generator controller 4 does not need to be composed of two current mirror circuits, namely the first and second current mirror circuits 4a and 4b. This is because a person skilled in the art would easily manage, without using two current mirror circuits, to draw in a current from the node N1 in the clock generator 1, or to pass a current toward the node N1, by using the current iv through the operational amplifier OP2, or a current converted from the current iv. Thus, a clock generator controller according to the present invention does not necessarily need a current mirror circuit as an essential element.

FIG. 7 shows an example where a charge pump circuit according to the present invention is used in a SMBus (system management bus) battery charger. A SMBus is a two-wire communication system that allows exchange of information, for example, among a smart battery, a host system, and a smart charger. A smart battery denotes a battery that is capable of monitoring the voltage and charge/discharge currents of a secondary battery by using a microprocessor incorporated in the battery itself and that exchanges data with a charger or with a load such as a computer.

A power supply device 300 shown in FIG. 7 has a SMBus interface capability. The power supply device 300 includes a host system HOST and an integrated circuit IC3. Between the host system HOST and the integrated circuit IC3, information is exchanged across two wires, namely a clock input SCL and a data input SDA.

Although not illustrated, the integrated circuit IC3, like the integrated circuits IC1 and IC2 described earlier, includes a clock generator 1, a voltage raiser 2, a voltage monitor 3, and a clock generator controller 4. As mentioned earlier, the voltage monitor 3 does not necessarily have to be provided. The integrated circuit IC3 further includes a SMBus and a synchronous-rectification step-down DC/DC switching regulator.

The integrated circuit IC3 has a comparatively large number of external terminals, which will now be described, along with the circuit elements and circuit functions connected to them, one by one counter-clockwise starting with the top left one as seen in FIG. 7.

An external terminal AGATE (TCP) corresponds to the raised output terminal TCP of the voltage raiser 2 described with reference to FIGS. 1, 2, 5, and 6. Connected to the external terminal AGATE is, via a resistor Ra, a control electrode G of a switching device SW1 as a first switching device. The switching device SW1 is a NMOS transistor, and between a first principal electrode S and the control electrode G thereof, a capacitor CAG is connected. The resistor Ra and the capacitor CAG constitute a low-pass filter; it suppresses a surge voltage or other undesired spike noise that may be applied to the control electrode G of the switching device SW1, and prevents an unnecessary current from passing into the switching device SW1. The first principal electrode S of the switching device SW1 is connected to a terminal ADA as a first supply power terminal. To the terminal ADA is connected, for example, an AC-DC adapter (hereinafter "AC adapter) for converting alternating-current power into direct-current power. A second principal electrode D of the switching device SW1 is connected to a first principal electrode D of a high-side transistor QH.

An external terminal VA is a first supply voltage supply terminal of the integrated circuit IC3. To the external terminal VA, a capacitor CVA is connected, and the external terminal VA is also connected via a resistor RVA to a cathode of a diode DVA. An anode of the diode DVA is connected to the terminal ADA. The resistor RVA and the capacitor CVA constitute a low-pass filter, and prevents an undesired spike voltage or current from passing in from the terminal ADA side. The diode DVA shuts off a current passing back from the external terminal VA side to the terminal ADA side.

An external terminal ACDET is a terminal that is provided for checking whether or not a first supply voltage vada supplied from the AC adapter to the terminal ADA is within a predetermined range. To the external terminal ACDET, a voltage resulting from the first supply voltage vada being divided by resistors R3 and R4 is applied. When the voltage applied to the external terminal ACDET is equal to or lower than a predetermined value, the switching device SW1 is so controlled as to be OFF.

External terminals SCL (clock input) and SDA (data input) are, as mentioned previously, terminals for connection with the two wires provided for SMBus interfacing. In practice, a SMBus interface requires external terminals other than those two external terminals for connection with the host system HOST, but for convenience' sake, those other terminals are omitted.

An external terminal GND is a ground potential terminal of the integrated circuit IC3.

An external terminal VB is a second supply voltage supply terminal of the integrated circuit IC3, and is provided separately from the above-mentioned external terminal VA, which is the first supply voltage supply terminal. To the external terminal VB is connected a rechargeable, so-called secondary, battery BATT. The power supply device 300, being capable of charging the secondary battery BATT connected to the external terminal VB, also has a circuit function as a so-called battery charger. To the external terminal VB is connected a first principal electrode S of a switching device SW2 as a second switching device.

An external terminal BGATE (TCP2) corresponds to the raised output terminal TCP of the voltage raiser 2 described with reference to FIGS. 1, 2, 5, and 6. The previously-mentioned external terminal AGATE (TCP1) too corresponds to the raised output terminal TCP of the voltage raiser 2. In fact, the integrated circuit IC3 incorporates a pair of each of clock generators 1, voltage raisers 2, voltage monitors 3, and clock generator controllers 4. That is, the integrated circuit IC3 incorporates a pair of voltage raisers 2, which are distinguished as a first voltage raiser and a second voltage raiser respectively. To the external terminal BGATE (TCP2) is connected, via a resistor Rb, a control electrode G of the switching device SW2. Of the switching device SW2, which is an NMOS transistor, a first principal electrode S is connected to the external terminal VB, and a second principal electrode D is connected to an external terminal SRN.

The external terminal SRN is provided as a so-cell current detection terminal for monitoring the current through the switching device SW2, and hence a charge current ich for charging the secondary battery BATT connected to the external terminal VB. Between the external terminal SRN and the ground potential GND, a ceramic capacitor CRN is connected which serves as a bypass for noise.

Like the previously-described external terminal SRN, an external terminal SRP is provided as a so-cell current detection terminal for monitoring the charge current ich. Between the external terminal SRP and the external terminal SRN, a current detection resistor RSR is connected which converts the charge current ich into a voltage. Between the external terminal SRP and the ground potential GND, a ceramic capacitor CRP is connected which serves as a bypass for noise.

An external terminal LDRV is a terminal from which a drive voltage for driving a low-side transistor QL is derived. The low-side transistor QL is arranged on the ground potential GND side of the synchronous-rectification DC/DC switching regulator. To the external terminal LDRV is connected a gate G of the low-side transistor QL, which is an NMOS transistor, and a source S of the low-side transistor QL is connected to the ground potential GND. Incidentally, in a case where asynchronous rectification is adopted, that is, a rectification diode is used instead of the low-side transistor QL, the external terminal LDRV is not needed.

An external terminal PHASE is an output terminal of the DC/DC switching regulator. Between the external terminal PHASE and the ground potential GND, an inductor L and a capacitor COUT are connected in series. To the external terminal PHASE are connected a drain D of the low-side transistor QL, a source S of the high-side transistor QH, and a first terminal of a bootstrap capacitor CBT. The high-side transistor QH and the low-side transistor QL constitute a synchronous-rectification step-down DC/DC switching regulator.

An external terminal HDRV is a terminal from which a drive voltage for driving the high-side transistor QH is derived. The high-side transistor QH is arranged on the source line side of the synchronous-rectification DC/DC switching regulator. The high-side transistor QH is an NMOS transistor, and has a gate G connected to the external terminal HDRV, a source S connected to the drain D of the low-side transistor QL, and a drain D connected to a second principal electrode D of the switching device SW1.

An external terminal BOOT is a terminal to which the bootstrap capacitor CBT is connected. The bootstrap capacitor CBT has a first end connected to the external terminal PHASE and a second end connected to the external terminal BOOT. In general, in a configuration where the high-side transistor of a DC/DC switching regulator is an NMOS transistor, a bootstrap circuit is provided. The bootstrap circuit requires a capacitor and a diode device, of which the latter is integrated in the integrated circuit IC3. The drive voltage raised by the unillustrated bootstrap circuit is applied to the gate G side of the high-side transistor QH. The bootstrap circuit brings the high-side transistor QH into a state sufficient to be turned ON.

The power supply device 300 shown in FIG. 7 can be used, for example, in a notebook personal computer. A notebook personal computer is commonly operated from two kinds of power sources. Specifically, a notebook personal computer can often switched between operation from an AC adapter and operation from a secondary battery BATT. During operation from the AC adaptor, the secondary battery BATT is often charged concurrently. In this case, the AC adapter serves as a battery charger.

As one component of the power supply device 300, the integrated circuit IC3 is furnished with circuit functions for coping with such different modes of use. These circuit functions, three of them, of the integrated circuit IC3 will now be described one by one.

A first circuit function with which the integrated circuit IC3 is furnished is performed when the AC adapter is connected to the terminal ADA and the secondary battery BATT connected to the external terminal VB is insufficiently charged. In this case, voltages at high level H are output to the external terminals AGATE and BGATE provided in the integrated circuit IC3, and thus the switching devices SW1 and SW2 are both ON. With the switching device SW1 (first switching device) ON, the first supply voltage vada is supplied to the drain D of the high-side transistor QH, an output voltage vout3 stepped down from the first supply voltage vada is output to an output terminal VOUT3, and the output voltage vout3 charges the secondary battery BATT connected to the external terminal VB. When the secondary battery BATT is charged up to a predetermined voltage, the switching device SW2 (second switching device) is turned OFF, and the electrical connection between the AC adapter and the secondary battery BATT is shut off.

A second circuit function of the integrated circuit IC3 is performed when the AC adapter is connected to the terminal ADA and the secondary battery BATT connected to the external terminal VB is sufficiently charged. That is, whereas the first circuit function takes place when the secondary battery BATT is insufficiently charged, the second circuit function takes place when the secondary battery BATT is sufficiently charged and is ready to output a predetermined voltage. In this case, a voltage at high level H is output to the external terminal AGATE provided in the integrated circuit IC3, and a voltage at low level L is output to the external terminal BGATE. Thus, the switching device SW1 is ON, but the switching device SW2 remains OFF. With the switching device SW1 ON, the output voltage vout3 is output to the output terminal VOUT3. However, with the switching device SW2 OFF, the electrical connection between the output terminal VOUT3 and the secondary battery BATT remains shut off.

A third circuit function of the integrated circuit IC3 is performed when there is no connection with the AC adapter and the integrated circuit IC3 starts up by operating from the secondary battery BATT. In this case, a voltage at low level L is output to the external terminal AGATE provided in the integrated circuit IC3, and a voltage at high level H is output to the external terminal BGATE. Thus, the switching device SW1 remains OFF, but the switching device SW2 is ON. With the switching device SW1 OFF and the switching device SW2 ON, a voltage is delivered from the secondary battery BATT to the output terminal VOUT3. At this time, a load current ihc passes through the current detection resistor RSR in the opposite direction to the charge current ich that passes when the secondary battery BATT is charged. The load current ihc is converted into a voltage by the current detection resistor RSR. When the load current ihc exceeds a predetermined range, it is recognized as an overcurrent, and the frequency Fclk of the clock signal CLK which drives the voltage raiser 2 (FIG. 6) connected to the external terminal BGATE which is on the control electrode G side of the switching device SW2 is so controlled as to be lowered to decrease the added-on voltage vup, increase the ON resistance of the switching device SW2, and thereby suppress the overcurrent. This operation is largely the same as the operation of the current detection resistor R2 described with reference to FIG. 6.

Figure 8:
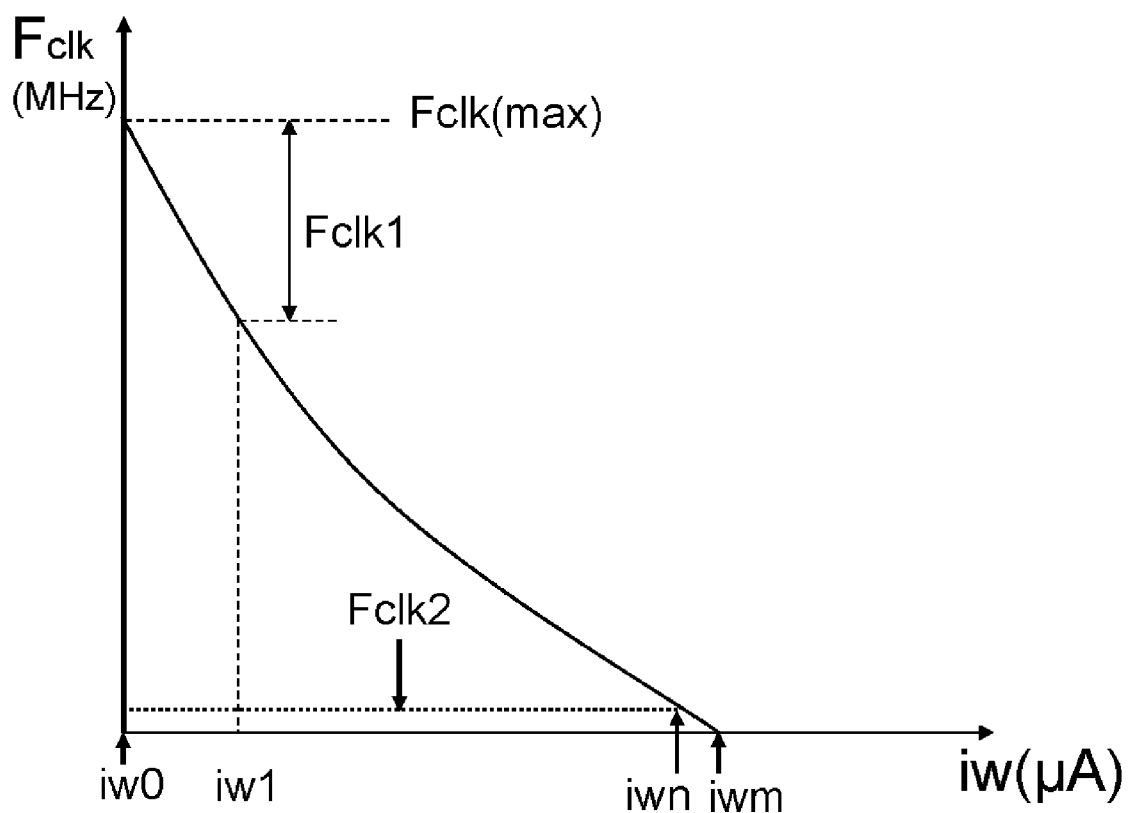
FIG. 8 is a characteristics diagram showing a relationship between a frequency control current through a clock generator controller used in the first and second embodiments of the present invention and the frequency of the clock signal generated by the clock generator 1.
Figure 9:
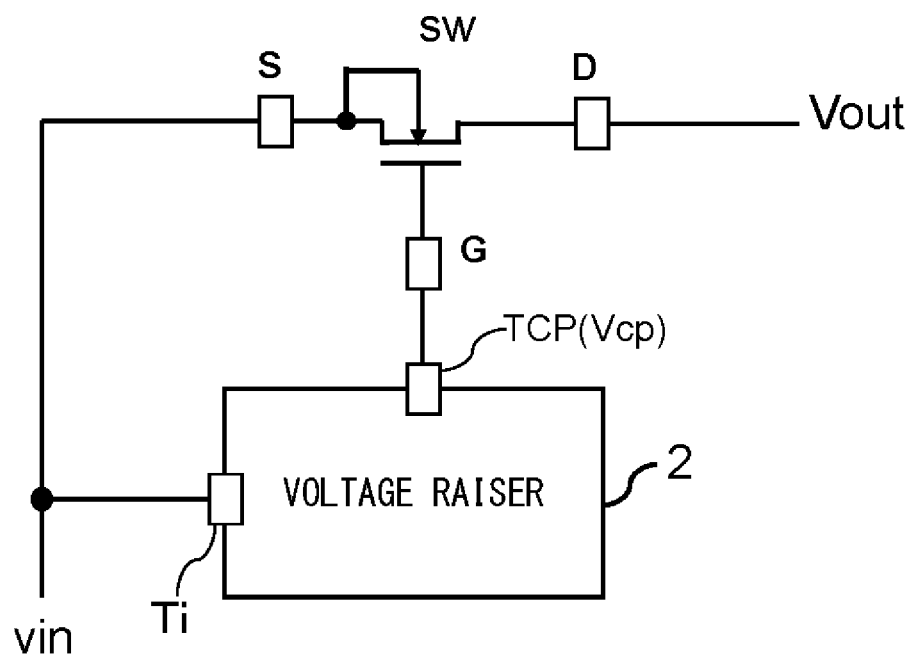
FIG. 9 is a diagram illustrating the basic operation of a charge pump circuit.

FIG. 8 shows the control characteristics of the frequency Fclk of the clock signal CLK. The horizontal axis represents the frequency control current iw which passes from the clock generator 1 to the clock generator controller 4, and the vertical axis represents the frequency Fclk. When the frequency control current iw equals zero, namely iw=iw0, the frequency Fclk of the clock signal CLK generated by the clock generator 1 is at its maximum, and the maximum frequency Fclk(max) is set at, for example, 200 kHz to 6 MHz. The minimum value iw0 of the frequency control current iw does not necessarily have to be zero, but may be any value so long as the maximum frequency Fclk(max) falls within the above-mentioned range. However, from the perspective of power saving, it is preferable that frequency control current iw0 be zero. A frequency control current iw1 is a minimum non-zero current value that fulfills the above-mentioned frequency range. A frequency in the range from the frequency Fclk of the clock signal CLK when the frequency control current equals iw1 to the maximum frequency Fclk(max) is herein referred to as a first frequency Fclk1. The first frequency Fclk1 appears in the period between time points t1 and t2 in FIG. 3. In the period between time points t1 and t2, a high-speed clock signal CLK is required so that a desired raised output voltage vcp is reached in a comparatively short time. The first frequency Fclk1 of the clock signal CLK that meets the requirement is, for example, 200 kHz to 6 MHz.

The frequency Fclk of the clock signal CLK lowers (decreases) as the frequency control current iw increases until, when the latter reaches a frequency control current iwn, the frequency Fclk of the clock signal CLK equals a frequency Fclk2. That is, the frequency Fclk2 lowers as the frequency control current iw increases. The frequency Fclk2 is herein referred to as a second frequency. Irrespective of whether the first frequency Fclk1 is 200 kHz or 6 MHz, the second frequency Fclk2 when the current value of the frequency control current iw equals iwn is set at about 20 kHz. Thus, the second frequency Fclk2 is set to be one or more digits lower than the first frequency Fclk1. Seeing that even when the first frequency Fclk1 equals, for example, 6 MHz, the second frequency Fclk2 is set at 20 kHz, it can be said that, preferably, the latter is set to be two or more digits lower than the former. However, when the second frequency Fclk2 is set at 20 kHz or lower, it falls within the human audible frequency range, and can be perceived, inconveniently, as annoying noise. Thus, it is preferable that the lower limit value of the second frequency Fclk2 be about 20 kHz. In other words, the second frequency is a frequency close to the upper limit value of the human audible frequency range. Moreover, the second frequency Fclk2 is set after time point t2 shown in FIG. 3. As will be clear from FIG. 3(*a*), after time point t2 is a period in which the raised output voltage vcp has reached the desired voltage level. After the raised output voltage vcp reaches the predetermined level, the voltage raiser 2 switches the clock signal CLK to one having a comparatively low frequency and a comparatively low duty ratio to save power.

As described brave, according to the invention disclosed herein, during the period until the raised output voltage reaches a predetermined value, voltage-raising operation is performed by use of a clock signal with a comparatively high frequency and, after the raised output voltage reaches the predetermined value, the frequency of the clock signal is lowered to suppress unnecessary power consumption. Thus, power saving is achieved.

INDUSTRIAL APPLICABILITY

As described above, a charge pump circuit according to the present invention achieves power saving with a comparatively simple circuit configuration, and is suitable for power source switching for a SMBus and the like. Its industrial applicability is thus extremely high.

What is claimed is:

1. A charge pump circuit, comprising:
   a clock generator configured to generate a clock signal whose frequency varies between a first frequency and a second frequency lower than the first frequency;
   a voltage raiser configured to generate a raised output voltage higher than a supplied input voltage by using the clock signal;
   a switching device receiving at a control electrode thereof the raised output voltage, the switching device receiving at a first principal electrode thereof first input supply power, the switching device yielding at a second principal electrode thereof first output supply power; and
   a clock generator controller configured to switch the frequency of the clock signal from the first frequency to the second frequency when the raised output voltage reaches a predetermined value or when a load current through the first or second principal electrode exceeds a predetermined value.

2. The charge pump circuit of claim 1, wherein the clock generator controller is configured to generate a frequency control current for controlling the clock generator such that, as the frequency control current increases, the first frequency lowers.

3. The charge pump circuit of claim 2, wherein the second frequency is one or more digits lower than the first frequency.

4. The charge pump circuit of claim 3, wherein a lower limit value of the second frequency is close to an upper limit value of a human audible frequency range.

5. The charge pump circuit of claim 1, wherein the clock generator comprises
   a ring oscillator comprising inverters or differential amplifiers or a combination of both connected in a ring formation and
   a CR oscillator comprising a resistor and a capacitor provided in connection paths in the ring oscillator.

6. The charge pump circuit of claim 5, wherein
   a first end of the resistor and a first end of the capacitor are connected together to an input of a first-stage inverter or differential amplifier of the inverters or differential amplifiers connected in the ring formation,
   a second end of the resistor is connected to an output of an odd-numbered-stage inverter or differential amplifier of the inverters or differential amplifiers connected in the ring formation, a second end of the capacitor is connected to an output of an even-numbered-stage inverter or differential amplifier of the inverters or differential amplifiers connected in the ring formation, and
   an output of the clock generator controller is connected to an input side of the first-stage inverter.

7. The charge pump circuit of claim 1, further comprising:
   a voltage monitor configured to monitor a voltage difference between the raised output voltage and the input voltage, wherein
   on detecting the voltage difference having reached a predetermined value, the voltage monitor activates the clock generator controller to achieve switching from the first frequency to the second frequency.

8. The charge pump circuit of claim 7, wherein the voltage monitor is a constant-voltage circuit including a diode function device.

9. The charge pump circuit of claim 8, wherein the voltage monitor includes a Zener diode.

10. The charge pump circuit of claim 9, wherein when a Zener current through the Zener diode is detected, the clock generator controller switches the clock signal from the first frequency to the second frequency.

11. The charge pump circuit of claim 10, wherein the clock generator controller is connected between the voltage monitor and the clock generator.

12. The charge pump circuit of claim 11, wherein
   the clock generator controller includes a current mirror circuit,
   a current transfer source-side transistor of the current mirror circuit is connected to the constant-voltage circuit,
   the Zener current through the Zener diode passes through the transistor, and
   the Zener current is a transfer source-side current of the current mirror circuit.

13. The charge pump circuit of claim 12, wherein
   the current mirror circuit comprises a first current mirror circuit and a second current mirror circuit,
   the first current mirror circuit comprises a first transistor and a second transistor,
   the second current mirror circuit comprises a third transistor and a fourth transistor,
   the first transistor is the transistor,
   the Zener current passes through the first transistor,
   a current through the first transistor is transferred to the second transistor,
   a current through the second transistor is input to the third transistor,
   a current through the third transistor is transferred to the fourth transistor,
   a current through the fourth transistor is a current that is either drawn from or passed into the clock generator, and
   the frequency of the clock signal generated by the clock generator is controlled by the current through the fourth transistor.

14. The charge pump circuit of claim 13, wherein the first and second transistors are pnp bipolar transistors, and the third and fourth transistors are npn bipolar transistors.

15. The charge pump circuit of claim 13, wherein the first and second transistors are PMOS transistors, and the third and fourth transistors are NMOS transistors.

16. The charge pump circuit of claim 1, wherein the switching device comprises a first switching device and a second switching device, the first and second switching devices each comprising a control electrode, a first principal electrode, and a second principal electrode, the voltage raiser comprises a first voltage raiser and a second voltage raiser, the first principal electrode of the first switching device is connected to a first supply power terminal, the second principal electrode of the first switching device is connected to a first principal electrode of a high-side transistor of a DC/DC switching regulator, a first raised output voltage output from the first voltage raiser is applied to the control electrode of the first switching device, the first principal electrode of the second switching device is connected to a second supply power terminal, the second principal electrode of the second switching device is connected via the DC/DC switching regulator to the second principal electrode of the first switching device, and a second raised output voltage output from the second voltage raiser is applied to the control electrode of the second switching device.

17. The charge pump circuit of claim 16, wherein a current detection resistor for monitoring a current through the first or second switching device is connected to the first or second principal electrode of the first or second switching device, and when a voltage across the current detection resistor exceeds a predetermined level, the clock generator controller is activated to switch the frequency of the clock signal from the first frequency to the second frequency.

18. The charge pump circuit of claim 17, wherein an AC adapter is connected to the first supply power terminal, and a secondary battery is connected to the second supply power terminal.

19. The charge pump circuit of claim 18, wherein when the first and second switching devices are ON, the secondary battery is charged via the AC adapter an the DC/DC switching regulator.

20. The charge pump circuit of claim 19, wherein when the secondary battery is charged up to a predetermined voltage value, the switching device 2 is turned OFF.

21. The charge pump circuit of claim 20, wherein when a first supply voltage supplied to the first supply power terminal is equal to or lower than a predetermined value, the first switching device is OFF and the second switching device is ON.

* * * * *